(12) United States Patent
Callaway et al.

(10) Patent No.: US 6,688,254 B2
(45) Date of Patent: Feb. 10, 2004

(54) VAPOR DEPOSITION TEMPERATURE CONTROL APPARATUS AND METHOD

(76) Inventors: Martin A. Callaway, HC 80, Box 512, Nallen, WV (US) 26680; Robert D. Adair, 8395 E. Pontaluna, Nunica, MI (US) 49448; Kenneth S. Murphy, 3839 Applewood, Muskegon, MI (US) 49441; Theodore J. Maniurski, 7264 Durham Rd., Whitehall, MI (US) 49461

( * ) Notice: Subject to any disclaimer, the term of this patent is extended or adjusted under 35 U.S.C. 154(b) by 119 days.

(21) Appl. No.: 09/965,432

(22) Filed: Sep. 27, 2001

(65) Prior Publication Data

US 2002/0015788 A1 Feb. 7, 2002

Related U.S. Application Data

(62) Division of application No. 09/201,648, filed on Nov. 30, 1998, now Pat. No. 6,319,569.

(51) Int. Cl.$^7$ .................. C23C 16/00; C23C 14/30
(52) U.S. Cl. ............. 118/723 EB; 118/724; 118/723 FE; 156/345.27; 427/585
(58) Field of Search .......... 118/723 EB, 723 CB, 118/715, 724, 723, 712, 719, 723 FE; 156/345.1, 345.24, 345.27, 345.26; 427/585, 596

(56) References Cited

U.S. PATENT DOCUMENTS

| | | |
|---|---|---|
| 4,286,540 A | 9/1981 | Bernath .................. 118/50 |
| 4,648,347 A | 3/1987 | Aichert et al. ............. 118/724 |
| 5,087,477 A | 2/1992 | Giggins et al. |
| 5,091,217 A | 2/1992 | Hey et al. ................ 427/248.1 |
| H1145 H | 3/1993 | Anderson ................... 118/725 |
| 5,256,162 A * | 10/1993 | Drowley et al. ........... 29/25.01 |
| 5,308,955 A | 5/1994 | Watanabe .................... 219/390 |
| 5,427,620 A | 6/1995 | deBoer et al. .............. 118/725 |
| 5,443,997 A | 8/1995 | Tsui et al. .................. 427/569 |
| 5,462,013 A | 10/1995 | Punola et al. .............. 118/719 |
| 5,520,742 A | 5/1996 | Ohkase ...................... 118/724 |
| 5,551,985 A | 9/1996 | Brors et al. ................. 118/725 |
| 5,601,652 A | 2/1997 | Giggins et al. |
| 5,716,720 A * | 2/1998 | Murphy .................... 427/623 |
| 5,775,416 A | 7/1998 | Heimanson et al. ........ 118/725 |
| 5,777,300 A * | 7/1998 | Homma et al. ............. 219/679 |
| 6,015,465 A | 1/2000 | Kholodenko et al. ....... 118/715 |
| 6,222,990 B1 * | 4/2001 | Guardado et al. .......... 392/416 |
| 6,403,927 B1 * | 6/2002 | Kato ......................... 219/390 |

FOREIGN PATENT DOCUMENTS

JP    5-121344 A  *  5/1993  .......... H01L/21/22

* cited by examiner

*Primary Examiner*—Parviz Hassanzadeh

(57) ABSTRACT

Coating temperature during vapor deposition of a ceramic coating on a substrate in a coating box or enclosure is maintained by means of a heat release cover or lid on the coating enclosure and movable in response to temperature in the coating enclosure exceeding a predetermined value so as to release excess heat from the enclosure to maintain coating temperature within an appropriate range.

6 Claims, 4 Drawing Sheets ered ceramic material inadvertently collects on the inside walls of the relatively cool coating box or enclosure in addition to depositing on the components to be coated. The collected ceramic material has been found to act as thermal insulation on the inside enclosure walls to an extent that excess heat can build up in the coating box or enclosure exceeding the preselected desired coating temperature for the particular components to be coated, resulting in defective or unacceptable coated components.

VAPOR DEPOSITION TEMPERATURE CONTROL APPARATUS AND METHOD

This is a division of Ser. No. 09/201,648 now U.S. Pat. No. 6,319,569 filed Nov. 30, 1998.

FIELD OF THE INVENTION

The present invention relates to vapor deposition and, more particularly, to physical vapor deposition of ceramic materials to form coatings on substrates.

BACKGROUND OF THE INVENTION

Ceramic coatings are applied to gas turbine engine hardware, such as turbine blades and vanes, to provide thermal protection against the high temperatures of the turbine engine. For example, so called thermal barrier coatings are applied to gas turbine engine blade and vane components by first depositing a bondcoat on the component followed by depositing a ceramic layer on the bondcoat by electron beam physical vapor deposition. In the electron beam physical vapor deposition of the ceramic layer, a source of the ceramic material, such as yttria stabilized zirconia, is heated by impinging an electron beam thereon to evaporate the ceramic material for deposition on the components, which are positioned in the ceramic vapor cloud to this end.

The electron beam physical vapor deposition of the ceramic layer on the turbine components is conducted in a stainless steel or other coating box or enclosure, which may be water cooled. It has been discovered by applicants that during the course of coating with the evaporated ceramic material, the ceramic coating material inadvertently collects on the inside walls of the relatively cool coating box or enclosure in addition to depositing on the components to be coated. The collected ceramic material has been found to act as thermal insulation on the inside enclosure walls to an extent that excess heat can build up in the coating box or enclosure exceeding the preselected desired coating temperature for the particular components to be coated, resulting in defective or unacceptable coated components.

It is an object of the present invention to provide method and apparatus that overcome the aforementioned problem and provide control of coating temperature during vapor deposition in a coating box or enclosure.

SUMMARY OF THE INVENTION

The present invention provides control of coating temperature during vapor deposition in a coating box or enclosure by means of a heat release lid or cover on the coating enclosure and movable in response to temperature in the coating enclosure so as to release excess heat from a heat vent opening of the enclosure to maintain coating temperature within an appropriate range.

In an illustrative embodiment of the present invention, a water cooled or non-cooled metal (e.g. water cooled copper or non-cooled stainless steel) coating enclosure includes a heat release cover movable relative to a heat vent opening of the enclosure. An actuator is connected to the heat release cover for raising away from the opening to discharge or vent excess heat in response to temperature inside the enclosure exceeding a predetermined value to maintain coating temperature within an appropriate range. Temperature in the coating enclosure is sensed by a thermocouple or other temperature sensing device and provides a temperature feedback signal to an automatic actuator or to a temperature gage monitored by a coating operator who raises or lowers the lid in response to sensed temperature in the coating enclosure.

The above objects and advantages of the present invention will become more readily apparent from the following detailed description taken with the following drawings.

DESCRIPTION OF THE INVENTION

Figure 1:
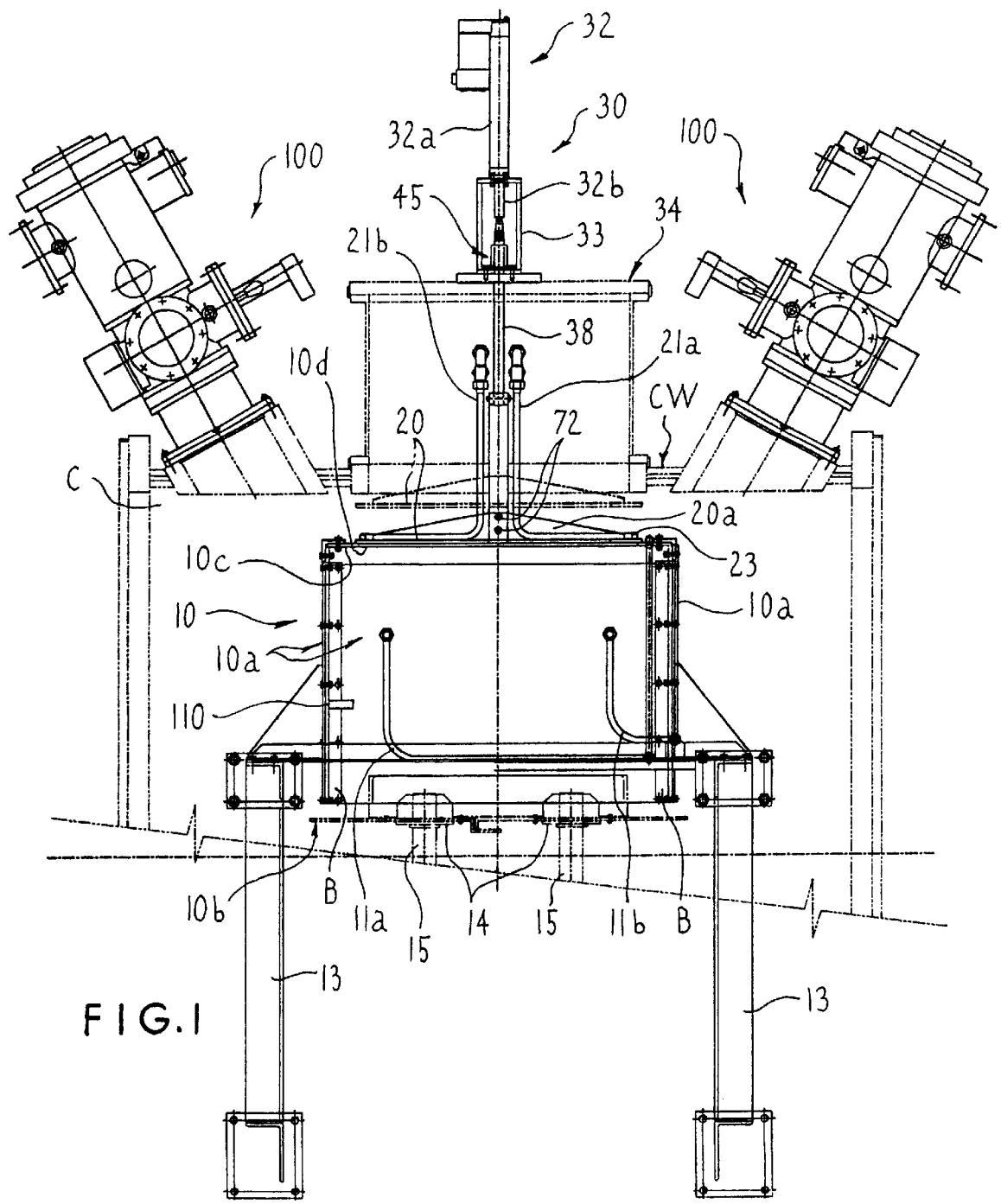
FIG. 1 is a side elevation of a vapor deposition apparatus in accordance with an embodiment of the invention.

In an embodiment of the present invention offered for purposes of illustration and not limitation, the substrate coating temperature during electron beam physical vapor deposition of a ceramic material on a substrate is maintained within appropriate preselected range to produce an acceptable coated substrate. For example only, the temperature of a superalloy substrate, such as a gas turbine engine blade or vane, having a bondcoat is maintained within appropriate preselected coating temperature range of, for example only, 1700 to 2000 degrees F. to achieve columnar ceramic coating structure that is characteristic of an acceptable coated superalloy substrate for service in a gas turbine engine during electron beam physical vapor deposition of a ceramic material thereon. The ceramic material typically can comprise yttria stabilized zirconia, or other suitable ceramic material, for deposition onto a metallic or intermetallic bondcoat comprising an aluminide diffusion layer, MCrAlY layer where M is Ni, Co, and/or Fe, or other suitable bondcoat, applied on the substrate as described, for example, in U.S. Pat. No. 5,716,720, the teachings of which are incorporated herein by reference to this end.

Referring to FIGS. 1–4, electron beam vapor deposition coating apparatus in accordance with an illustrative embodiment of the invention is illustrated as comprising a water cooled copper or stainless steel non-cooled coating box or enclosure 10 supported by various support members 13 inside a vacuum chamber C. Typically, multiple substrates S (two shown for convenience) to be coated are held in the enclosure 10 in grips or fixtures 12 of manipulator 18 shown schematically in FIG. 2 and forming no part of the invention. As mentioned above, the substrates S can comprise gas turbine engine blades or vanes having a bondcoat thereon. The manipulator 18 typically rotates the blades or vanes about their longitudinal axes during coating.

The coating enclosure 10 includes four side walls 10a, a bottom wall 10b and a top wall 10c, which can be water cooled copper walls or non-cooled stainless steel walls. Bottom wall 10b has a pair of ingot hearths 14 disposed therein. The walls 10a and top wall 10c can be water cooled by flexible cooling water supply and return lines 11a, 11b connected to a source of cooling water (not shown), such as a closed circuit chiller, and copper tubing (not shown) on the outside surfaces of the enclosure walls when a water cooled copper enclosure is employed. Electron beam guns 100 in the top wall are adapted to direct respective electron beams to impinge on sources 15 of ceramic material, such as for example yttria stabilized zirconia ingots, in a manner to evaporate ceramic material from the sources 15 to form vapor clouds in which the substrates S are rotated by manipulator 18 for deposition of the vaporized ceramic material thereon as a coating.

Figure 2:
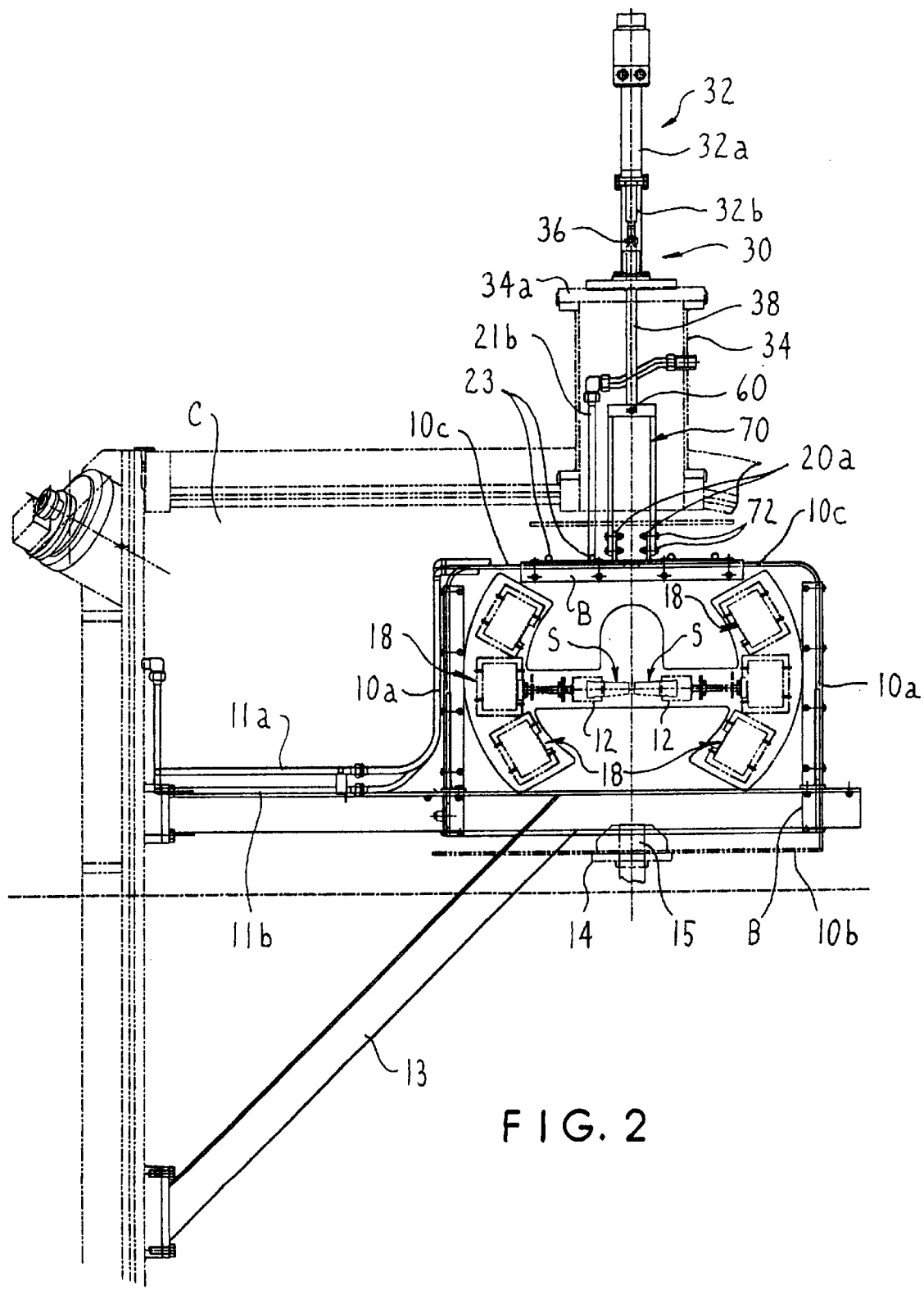
FIG. 2 is a partial side elevation of the same apparatus taken normal to FIG. 1 with the coating enclosure open on a side to reveal substrates and substrate manipulator.

The coating box or enclosure includes top wall 10c having a heat vent opening 10d therein which is closed off by a heat release cover 20 that comprises water cooled or non-cooled stainless steel copper plate. The heat release cover 20 is sized to overlie the opening 10d and a portion of the top wall 10c of the enclosure so as to, in effect, close off the heat vent opening 10d when the cover 20 resides on the top wall 10c as shown in FIGS. 1–2. There is no seal on the cover 20 or the top wall. In the closed position shown, the cover 20 substantially prevents heat from escaping from the coating enclosure 10 via the vent opening.

The cover 20 is lowered by an actuator assembly 30 mounted on posts 33 to the closed position shown in solid lines to close off the heat vent opening or raised to the dashed line position to open the opening 10d to vacuum chamber C to release or vent excess heat. The actuator assembly includes electric actuator 32 located outside the vacuum chamber C atop an actuator housing 34 that is vacuum tight sealed (e.g. bolted with O-ring seals not shown) on the vacuum chamber C. The actuator 32 may comprise an electric linear actuator available from Industrial Devices Corp. as model #ND355B4-MF1-FC2-BS-L with RPS-1 accessories for lowering/raising the cover 20 relative to opening 10d.

Figure 3:
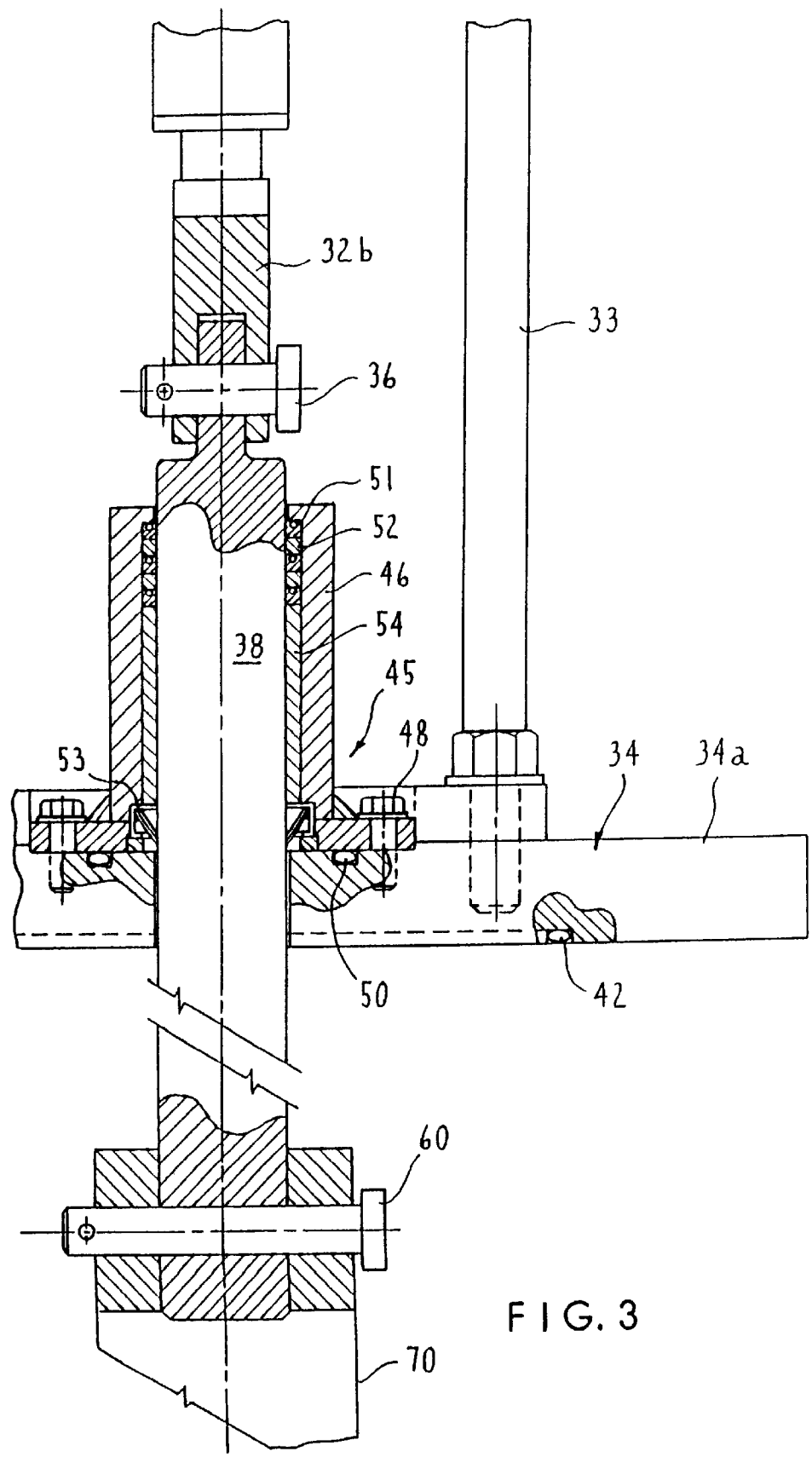
FIG. 3 is an enlarged partial sectioned view of the lid lift actuator assembly.
Figure 4:
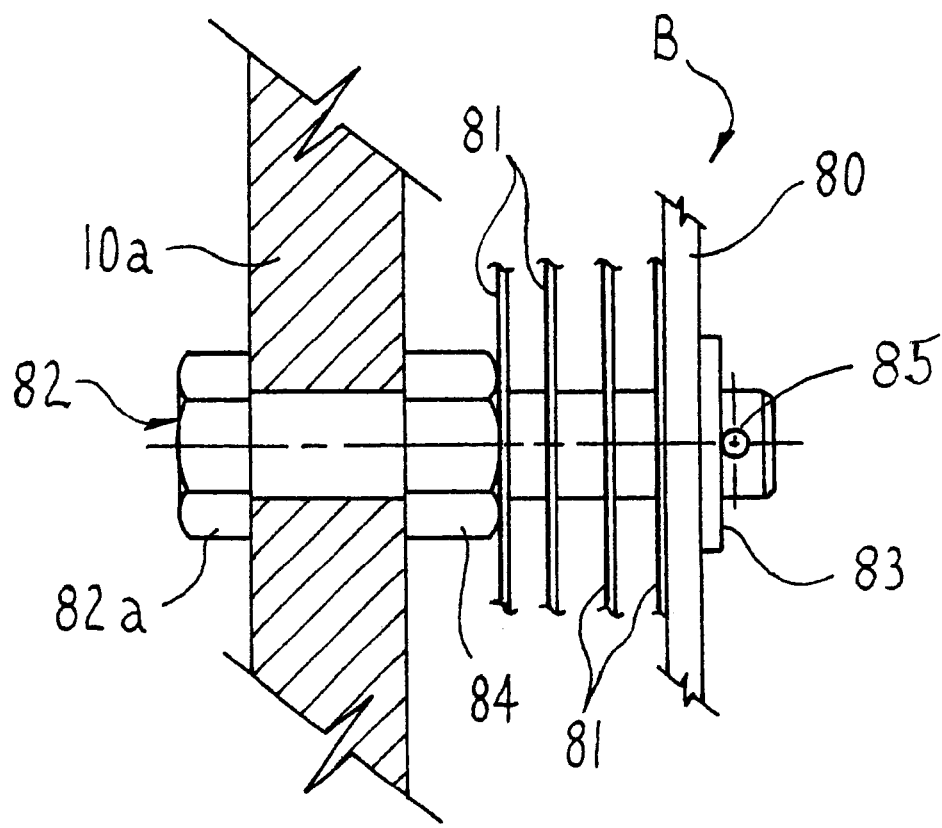
FIG. 4 is partial elevational view of the baffles on the enclosure side walls and the wall of the heat release cover.

The actuator 32 includes a ball screw 32a and rod 32b with the rod connected by a clevis pin 36 to lift rod 38 that extends through a vacuum seal assembly 45 disposed on the top wall 34a of the housing 34. Referring to FIG. 3, the top wall 34a is mounted on the housing 34 with an O-ring seal 42 therebetween and the lift rod 38 extends through vacuum seal assembly 45 that includes a rod guide housing 46 fastened to the support plate by threaded bolts or fasteners 48 with an O-ring 50 therebetween. Various sealing/bearing elements are disposed between the rod guide housing 46 and the lift rod 38 such as Parker Poly-Pak seal 51 available from Parker Hannifin Corporation, bronze spacer 52, seal guard wiper seal 53 and bronze housing 54 in FIG. 3.

The lift rod 38 is connected by a clevis pin 60 to a lift bracket 70 inside the vacuum chamber C as shown in FIG. 3. The lift bracket, in turn, is connected to upwardly extending flanges 20a of the cover 20 by conventional fasteners 72. In this manner, the heat release cover 20 can be lowered/raised by the actuator assembly 30 relative to the heat vent opening 10d.

The cover 20 can be water cooled via flexible cooling water supply and return lines 21a, 21b connected to a source of cooling water (not shown) such as closed circuit chiller and copper tubing 23 on the outside surface of the cover 20.

The inside of the enclosure walls 10a and the inside wall of the cover 20 include baffle assemblies B for purposes of condensate collection and removal. The baffle assemblies, FIG. 4, each comprise an innermost stainless steel wire cloth (8 mesh) sheet 80 and multiple stainless steel foil sheets 81 each comprising a heat shield supported on fastener (e.g. bolt) 82 retained by lock washer 83 and wire 85. The fastener 82 is mounted on the enclosure inner walls 10a and inner wall of the cover 20 using the bolt head 82a and nut 84.

During coating of the substrates S in the coating enclosure 10, a relative vacuum is maintained in vacuum chamber C and in the enclosure 10. The cover 20 initially is positioned on the top wall 10c of the enclosure to close off the heat vent opening 10d as shown in solid lines in FIGS. 1–2. In continuous operation of the coating machine, vaporized ceramic build-up accumulates on the enclosure 10 and slows the transfer of heat away from the enclosure. Consequently, the temperature in the enclosure 10 rises with operation time. The temperature rise is detected by thermocouple 110 located on the enclosure 10 or on manipulator 18 and provides a signal indicative of excess heat and a corresponding substrate coating temperature outside the preselected specification range.

The actuator assembly 30 is actuated in response to the excess temperature detected in the enclosure 10. In particular, the actuator 32 is actuated to raise the cover 20 away from the top wall 10d to open the heat vent opening to the vacuum chamber C to release the excess heat and maintain the desired substrate coating temperature range in the enclosure 10. The cover 20 will remain raised above the opening 10d as long as necessary to maintain the substrate coating temperature in response to the sensed temperature in the enclosure 10. When appropriate substrate coating temperature returns within the specified range, the cover 20 can be lowered by the actuator assembly 30 fully back onto the top wall 10c or partially to any distance toward the top wall necessary to maintain temperature specifications in the enclosure. The present invention thereby provides method and apparatus that for controlling substrate coating temperature during vapor deposition in a coating box or enclosure in a manner that produces acceptable coated components.

Although the invention has been described in terms of specific embodiments thereof, it is not intended to be limited thereto but rather only to the extent set forth hereafter in the appended claims.

We claim:

1. Vapor deposition coating apparatus comprising, an outer vacuum chamber, a coating enclosure which is disposed in said outer chamber and in which a substrate to be coated is positioned, a heat release cover closing off a heat vent opening in said coating enclosure, and an actuator connected to said cover and responsive to temperature in said coating enclosure to move said cover in a manner that said heat vent opening communicates an interior of said coating enclosure to said outer vacuum chamber to release excess heat from said coating enclosure to said outer chamber and maintain substrate coating temperature in a preselected temperature range.

2. The apparatus of claim 1 wherein said heat vent opening is disposed in a top wall of said coating enclosure and said cover overlies said heat vent opening.

3. The apparatus of claim 1 wherein said coating enclosure and said cover are water-cooled or non-cooled.

4. The apparatus of claim 1 wherein said actuator comprises a ball screw having a rod connected to said cover.

5. The apparatus of claim 4 wherein said actuator includes a housing that is air tight sealed on the vacuum chamber in which said coating enclosure is positioned.

6. The apparatus of claim 1 including a temperature sensor for sensing temperature inside said coating enclosure during coating and providing a signal to said actuator.

* * * * *